(12) United States Patent
Kim

(10) Patent No.: US 7,197,325 B2
(45) Date of Patent: Mar. 27, 2007

(54) POWER CONTROL APPARATUS WITH PAM REFERENCE VOLTAGE TUNER FOR A MOBILE TERMINAL

(75) Inventor: Gi-Mun Kim, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 435 days.

(21) Appl. No.: 10/162,762

(22) Filed: Jun. 6, 2002

(65) Prior Publication Data

US 2002/0193134 A1 Dec. 19, 2002

(30) Foreign Application Priority Data

Jun. 7, 2001 (KR) ................................ 2001/31747

(51) Int. Cl.
*H04B 7/00* (2006.01)
*H04Q 7/20* (2006.01)
(52) U.S. Cl. ............... 455/522; 455/126; 455/13.4; 455/69; 455/127.1; 455/114.3; 455/570; 455/571; 455/572
(58) Field of Classification Search ............... 455/522, 455/126, 13.4, 69, 127.1, 127.5, 114.3, 570, 455/571, 572, 573, 574, 7
See application file for complete search history.

(56) References Cited

U.S. PATENT DOCUMENTS 6,011,980 A * 1/2000 Nagano et al. ............. 455/572
6,118,988 A * 9/2000 Choi .......................... 455/115.1
6,259,901 B1 * 7/2001 Shinomiya et al. ........ 455/127.3
6,356,745 B1 * 3/2002 Lee et al. ................... 455/232.1
6,374,116 B1 * 4/2002 Peterzell et al. ............ 455/522
6,701,138 B2 * 3/2004 Epperson et al. .......... 455/127.3
6,718,165 B1 * 4/2004 Ha ............................. 455/234.2

* cited by examiner

*Primary Examiner*—Matthew D. Anderson
*Assistant Examiner*—Shaima Q. Aminzay
(74) *Attorney, Agent, or Firm*—Fleshner & Kim, LLP

(57) ABSTRACT

A transmission power control apparatus of a mobile terminal includes an intermediate frequency automatic gain controller for receiving a transmission intermediate frequency signal and performing an intermediate frequency automatic gain adjustment. A power amplifier for amplifying the transmission intermediate frequency signal. A mobile station modem (MSM) for outputting a transmission gain control signal to the intermediate frequency automatic gain controller, and a reference voltage control unit for receiving the transmission gain control signal and outputting a reference voltage to the power amplifier are also provided. Since the change of the reference voltage is always under control in the power mode switching, the burst noise occurrence due to the sudden reference voltage change in the transmission power can be restrained, and increased battery use time can be achieved by using a low reference voltage in the low power mode.

46 Claims, 6 Drawing Sheets

POWER CONTROL APPARATUS WITH PAM REFERENCE VOLTAGE TUNER FOR A MOBILE TERMINAL

BACKGROUND OF THE INVENTION

1. Field of the Invention

The present invention relates to a mobile terminal, and more particularly, to a power control apparatus for a mobile terminal.

2. Background of the Related Art

FIG. 1 is a schematic block diagram showing the power control mechanism of a conventional mobile terminal. As shown in FIG. 1, the transmission power source control includes an intermediate frequency automatic gain controller (IF AGC) 1 for performing intermediate frequency (IF) gain control based on a transmission intermediate frequency signal TX_IF). An up-mixer 2 for up-converting the IF signal by mixing the adjusted IF signal with a local oscillation frequency generated from a local oscillator 6. A driver amplifier 3 for amplifying the up-converted frequency signal, and an image filter 4 for removing harmonics of the up-converted frequency signal. A power amplifier module (PAM) 5 for amplifying the band-passed frequency signal, and power control means 7 for adjusting an closed-loop gain of the power amplifier module 5. An IF gain control means 8 for outputting an IF gain control signal to control the gain of the IF gain controller 1.

In the transmission power control described above, the transmission power of a mobile terminal is controlled by adjusting the gain of the IF automatic gain controller 1 under the control of a mobile station modem (MSM). That is, the MSM sends a transmission gain control signal (TX_AGC_ADJ) to the IF gain control means 8 to transmit a transmission power in corresponding to a reception power, and the IF gain control means 8 generates a power suitable for the transmission power based on the transmission gain control signal (TX_AGC_ADJ) and sends the same power to the IF automatic gain controller 1.

Further, in order to restrain the generation of the harmonics and transmission noises of the transmission power of a mobile terminal and minimize the power consumption, a level of a reference voltage (PAM Vref) of the power amplifier module (PAM) that consumes the most current should be appropriately controlled. The reference voltage (PAM Vref) of the PAM 5 is obtained by the following equation:

$$Vref = \frac{VCC\_TX \times R2}{R1 + R2} \quad (1)$$

wherein the resistors (R1, R2) distribute a voltage level of the transmission power source (VCC_TX) to be applied as the reference voltage (PAM Vref) to the PAM 5 according to a power mode within the power control means 7, and are connected in parallel with each other when a switch SW1 is turned off.

In the power control means 7, the switch SW1 is turned on or off depending on a power mode select signal (PA_R1) from the MSM. In a low power mode (PA_R1=LOW), the switch SW1 is turned off to decrease the gain of the power control means 7, and further restrain the occurrences of harmonics, therefore, reduce the power consumption. Meanwhile, in a high power mode (PA_R1=HIGH), the switch SW1 is turned on, and the transmission voltage (VCC_TX) is provided to the PAM 5 as a reference voltage for obtaining a sufficient gain.

In equation (1), if the switch SW1 of the power control means 7 is turned to enter the high power mode, R1 becomes 0 and Vref becomes equal to VCC_TX. When the power mode is converted from the lower power mode to the high power mode, the gain of the PAM 5 abruptly jumps up. A switch SW2 of the IF gain control means 8 is then turned on for decreasing the gain of the IF automatic gain controller 1, and therefore minimize the influence from the abrupt gain change.

After the power mode is converted, the MSM gradually increases the level of the transmission gain control signal (TX_AGC_ADJ) so as to increase the gain of the IF automatic gain controller 1. However, the conventional transmission power control mechanism has a drawback that the transmission power jumps up (see FIG. 2), hence, first noise unavoidably occurs. When the gain control start point of the IF automatic gain controller 1, which decreases the gain of the IF automatic gain controller 1, and the gain control start point of the PAM 5, which increases the gain of the PAM 5, are not identical with each other while adjusting the abrupt change of the transmission power during mode conversion from the low power mode to the high power mode, the jumps up occurs.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

It is an object of the present invention to provide a transmission power control apparatus of a mobile terminal that is capable of preventing a burst noise occurrence by preventing a sudden change of a transmission power while a power mode of the mobile terminal is converted from a low power mode to a high power mode.

To achieve this and other advantages in accordance with the purpose of the present invention, as described in one of the preferred embodiments herein, a transmission power control method and apparatus of a mobile terminal is provided. The power control apparatus comprises an intermediate frequency automatic gain controller, which receives a transmission intermediate frequency signal and performs an intermediate frequency automatic gain adjustment; a power amplifier module, which amplifies the transmission intermediate frequency signal; a mobile station modem (MSM), which outputs a transmission gain control signal (TX_AGC_ADJ) to the intermediate frequency automatic gain controller; and a reference voltage control unit for receiving the transmission gain control signal and outputting a reference voltage (PAM_Vref) to the power amplifier module.

In the transmission power control apparatus of a mobile terminal of the present invention, the reference voltage control unit comprises a reference voltage tuner for controlling a voltage from a transmission power source (VCC_TX) and a reference voltage applied to the power amplifier module, and an actuator for receiving the output from the reference voltage tuner and the transmission gain control signal outputted from the MSM, the reference voltage and control signal are amplified with a suitable gain and outputted to the reference voltage tuner.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENTS

Reference will now be made in detail to the preferred embodiments of the present invention, examples of which are illustrated in the accompanying drawings. The process that a transmission power control apparatus receives and amplifies an IF signal is similar to the conventional transmission power control process.

Figure 1:
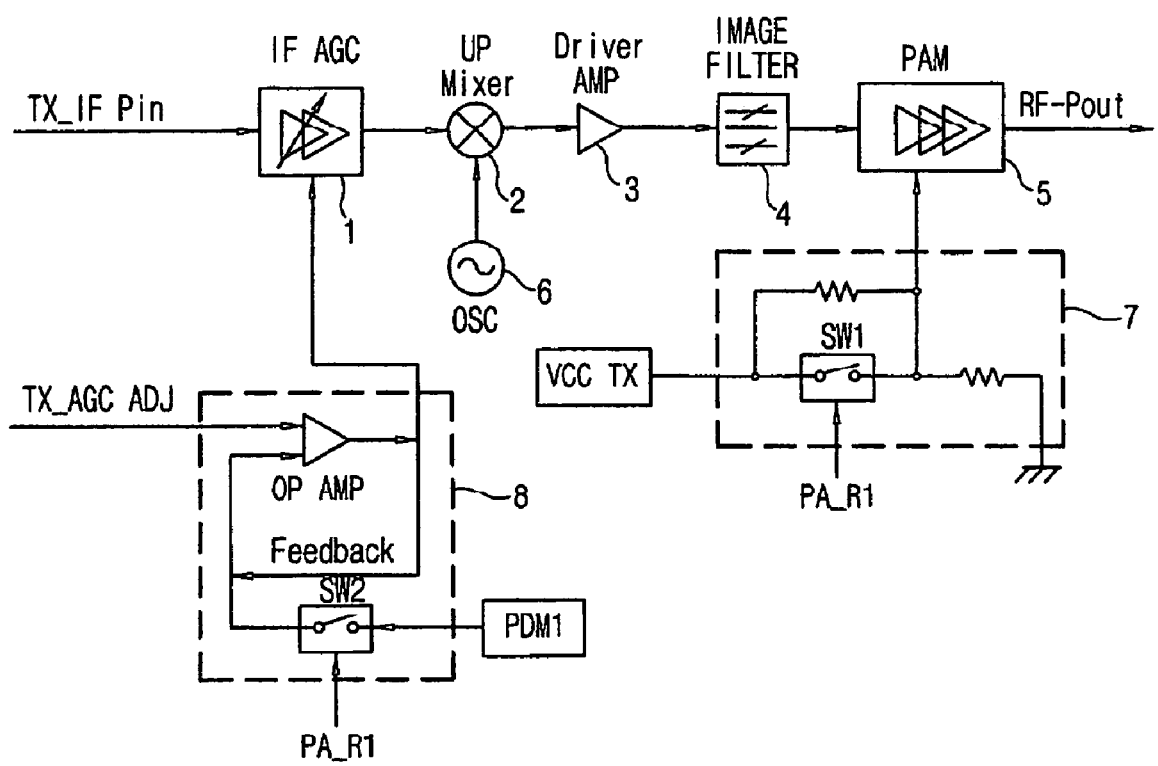
FIG. 1 is a schematic block diagram of a conventional transmission power control mechanism for a mobile terminal.
Figure 2:
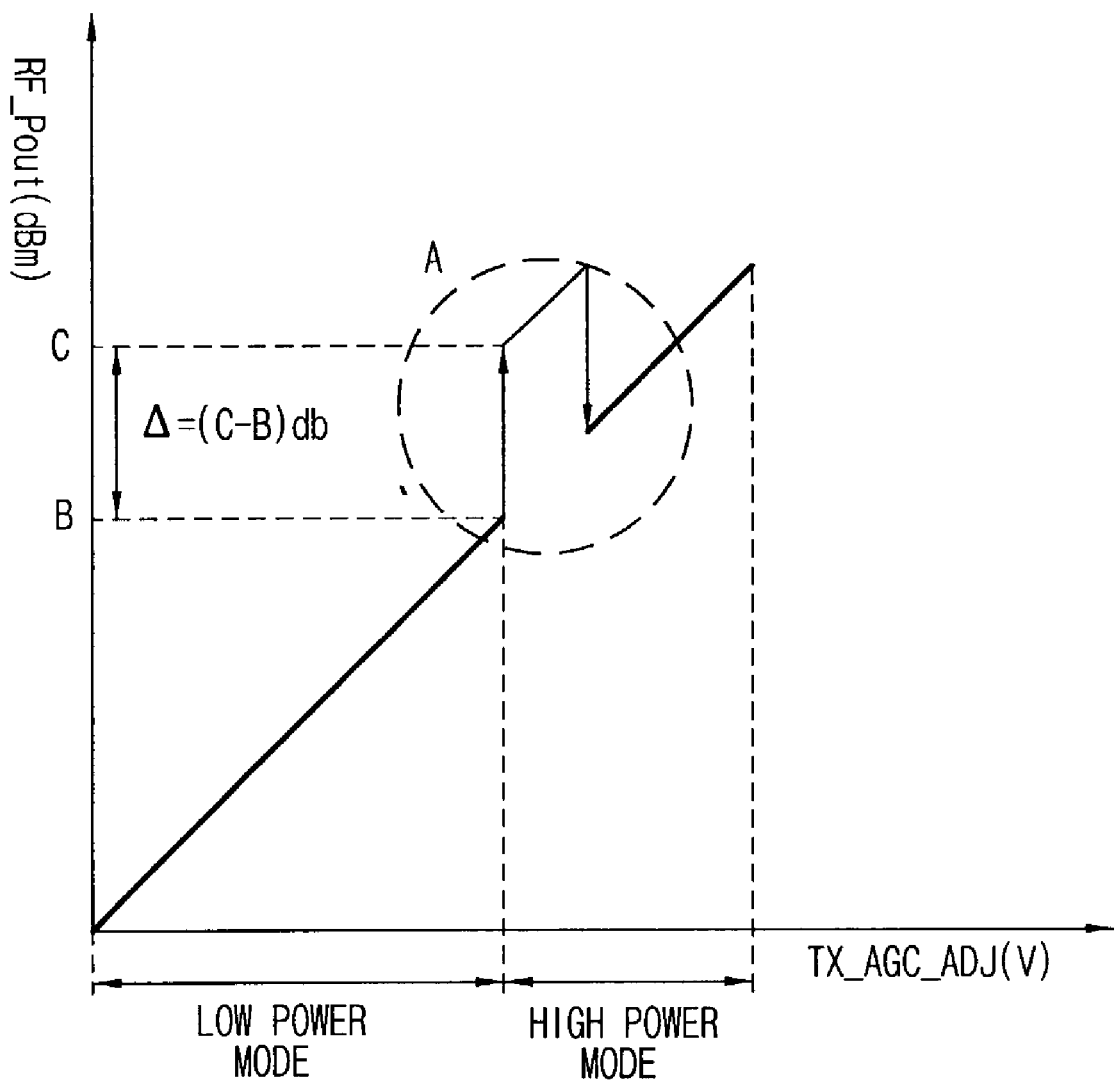
FIG. 2 is a graph illustrating a change of a transmission power of the control apparatus of FIG. 1 during a power mode conversion from a low power mode to a high power mode.
Figure 3:
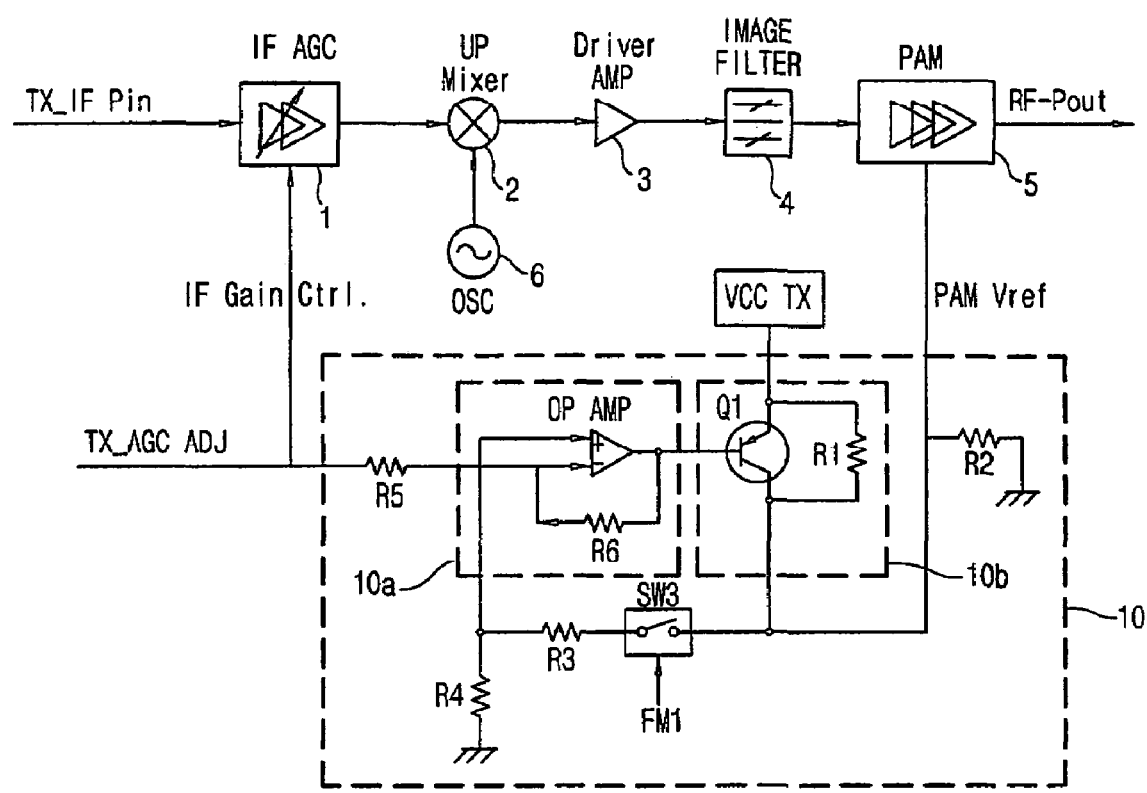
FIG. 3 is a block diagram illustrating a transmission power control apparatus of a mobile terminal in accordance with a preferred embodiment of the present invention.

With reference to FIG. 3, a transmission power control apparatus of the present invention includes an IF automatic gain controller 1 for receiving a transmission IF signal (TX_IF) and the controller performs an IF automatic gain adjustment based on the IF gain control signal (IF Gain Ctrl) from a mobile station module (MSM). An up-mixer 2 for mixing the adjusted IF signal with a local oscillation frequency generated from a local oscillator 6 up-converts the IF signal, and a driver amplifier 3 for amplifying the up-converted frequency signal. An image filter 4 for removing harmonics of the up-converted frequency, and a power amplifier module (PAM) 5 for amplifying the band-passed frequency signal. A reference voltage control unit 10 for controlling amplification degree of the PAM 5.

The reference voltage control unit 10 includes an actuator 10a for amplifying a transmission gain control signal (TX_AGC_ADJ) outputted from an MSM (not shown) with an appropriate gain. A reference voltage tuner 10b for outputting a reference voltage (PAM Vref) to be applied to the PAM 5 according to a voltage level outputted from the actuator 10a, and a system mode select switch SW3 (FM/) for selecting one of system modes, for example, a code division multiple access (CDMA) and advanced mobile phone service (AMPS) modes.

The system mode select switch SW3 is a switch added to enhance the safety of PAM 5 in the analog mode (AMPS) and is turned on or off based on a system mode select signal (FM/) from the MSM. That is, when the system mode select signal (FM/) is LOW, the mobile terminal enters the AMPS mode, if the system mode select signal (FM/) is HIGH, the mobile terminal enters the CDMA mode.

In the AMPS mode, the system mode select switch SW3 is opened such that a voltage applied to a non-inverting terminal (+) of the actuator 10a becomes 0V. On the other hand, if the power mode select unit 10b is constantly in an ON state and the reference voltage (PAM Vref) is constantly VCC_TX, the 3.2 V reference voltage is steadily applied to the power amplifier module 5.

In the CDMA mode, the switch SW3 is closed, hence a certain level of voltage (for example, 1.5V) is applied to the non-inverting terminal (+) of the actuator 10a, and the reference voltage tuner 10b is in an OFF state, i.e., in a low power mode, until the level of the transmission automatic gain control signal (TX_AGC_ADJ) applied to the inverting terminal (−) increases to reach a predetermined level. In the low power mode, the transmission power source (VCC_TX) (for example, 3.2V) is distributed by the first and second resistances (R1, R2) and applied to the PAM (5).

As the voltage level of the transmission automatic gain control signal (TX_AGC_ADJ) increases to reach the predetermined level, the voltage applied to the non-inverting terminal (+) gradually increases and reaches to a high power mode entrance voltage, and meanwhile the reference voltage tuner 10b is gradually turned on. The reference voltage (PAM Vref) gradually increases until the reference voltage tuner 10b is completely turned on. At the same time, the power mode is continuously converted from the lower power mode to the high power mode. The detailed operation of the above structured transmission power control apparatus of the present invention will now be described hereinafter.

First, if a transmission power control bit is received from a base station while a certain voltage (for example, 1.5V) is applied to the non-inverting terminal (+) of the actuator 10a of the reference voltage control unit 10 in the low power mode, the MSM generates a transmission gain control signal (TX_AGC_ADJ) based on the control bit, and the MSM inputs the transmission gain control signal (TX_AGC_ADJ) to the inverting terminal (−) of the actuator. The actuator 10a amplifies the difference between voltages applied to the inverting terminal (−) and the non-inverting terminal (+) and applies an output voltage to the base terminal of the reference voltage tuner 10b. At this time, a closed-loop gain (G) of the actuator is obtained by following equation:

$$G = \frac{R6}{R5} \quad (2)$$

In the low power mode, since the level of the transmission gain control signal (TX_AGC_ADJ) is smaller than the voltage applied to the non-inverting terminal (+), a high voltage is applied to the base terminal. In this case, the voltage applied to the non-inverting terminal (+) of the actuator 10a and the reference voltage (PAM Vref) applied to the PAM 5 can be calculated by following equations (3) and (4).

$$Vref = \frac{VCC\_TX \times R2}{R1 + R2} \quad (3)$$

$$Vin = \frac{Vref \times R4}{R3 + R4} \quad (4)$$

When the voltage of the transmission gain control signal (TX_AGC_ADJ) increases to reach the low power mode voltage applied to the non-inverting terminal (+), the input to the base terminal of the transistor Q1 becomes low, and at this time, the resistance to the transmission power source (VCC_TX) is determined by an internal resistance ($R_{Q1}$) of the transistor (Q1) and the resistance R1 connected in parallel.

Figure 4:
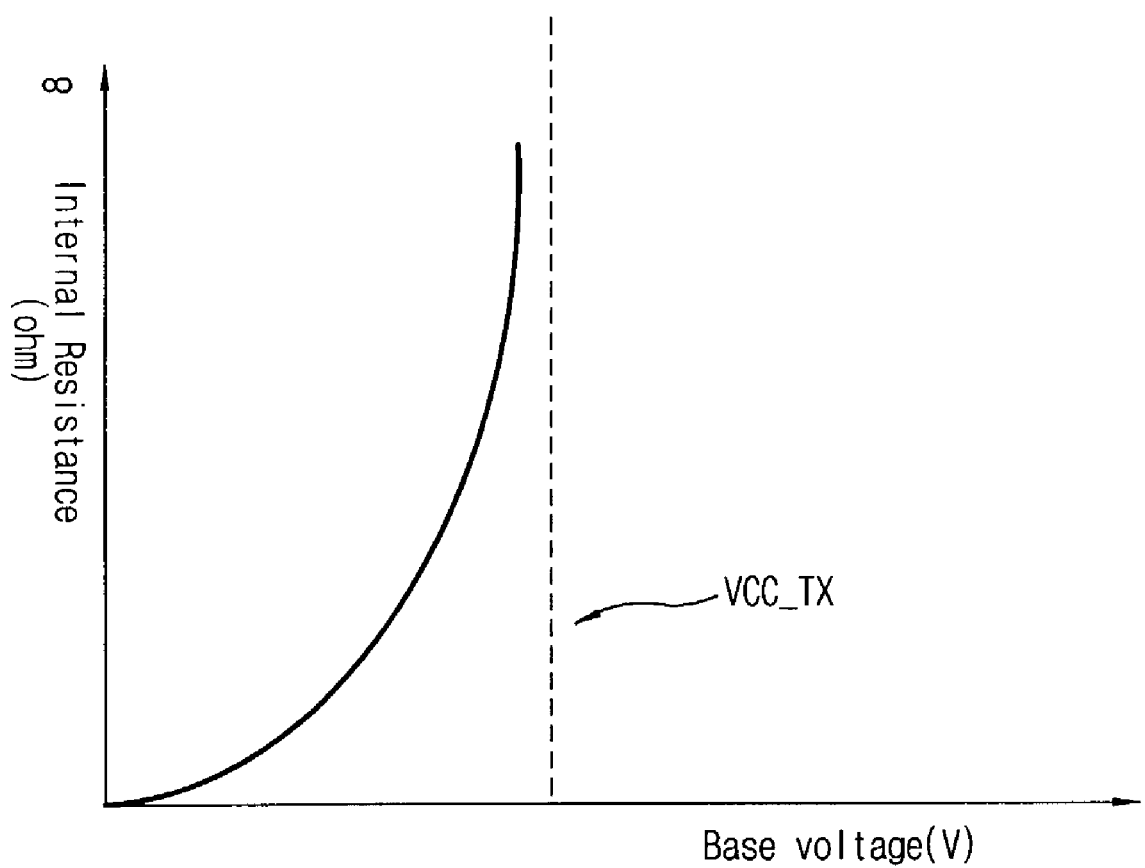
FIG. 4 is a graph illustrating a change of an internal resistance relative to a voltage applied to the base of a transistor of a reference voltage tuner of the transmission power control apparatus of FIG. 3.

FIG. 4 shows a change of the internal resistance relative to the base voltage of the transistor Q1. Further, it is noted that when the base voltage of the transistor Q1 is at a high level, the internal resistance $R_{Q1}$ becomes infinite ($\infty$) and the value of the resistance connected to the transmission power source (VCC_TX) becomes R1.

If the voltage level of the transmission gain control signal (TX_AGC_ADJ) continuously increases to be equal to the voltage applied to the non-inverting terminal (+), 0V is applied to the base terminal of the transistor Q1 and the internal resistance $R_{Q1}$ becomes 0 ohm such that the serial resistance ($R_{VCC\_TX}$) to the transmission power source (VCC_TX) also becomes 0 ohm. The serial resistance ($R_{VCC\_TX}$) to the transmission power source (VCC_TX) is obtained by following equation (5):

$$R_{VCC\_TX} = \frac{R1 \times RQ1}{R1 + RQ1} \quad (5)$$

Based on this equation, when the resistance connected to the transmission power source (VCC_TX) becomes '0', the reference voltage (Vref) to the PAM 5 becomes almost equal to the voltage of the transmission power source (VCC_TX0) so that the power mode is converted to the high power mode.

Figure 5:
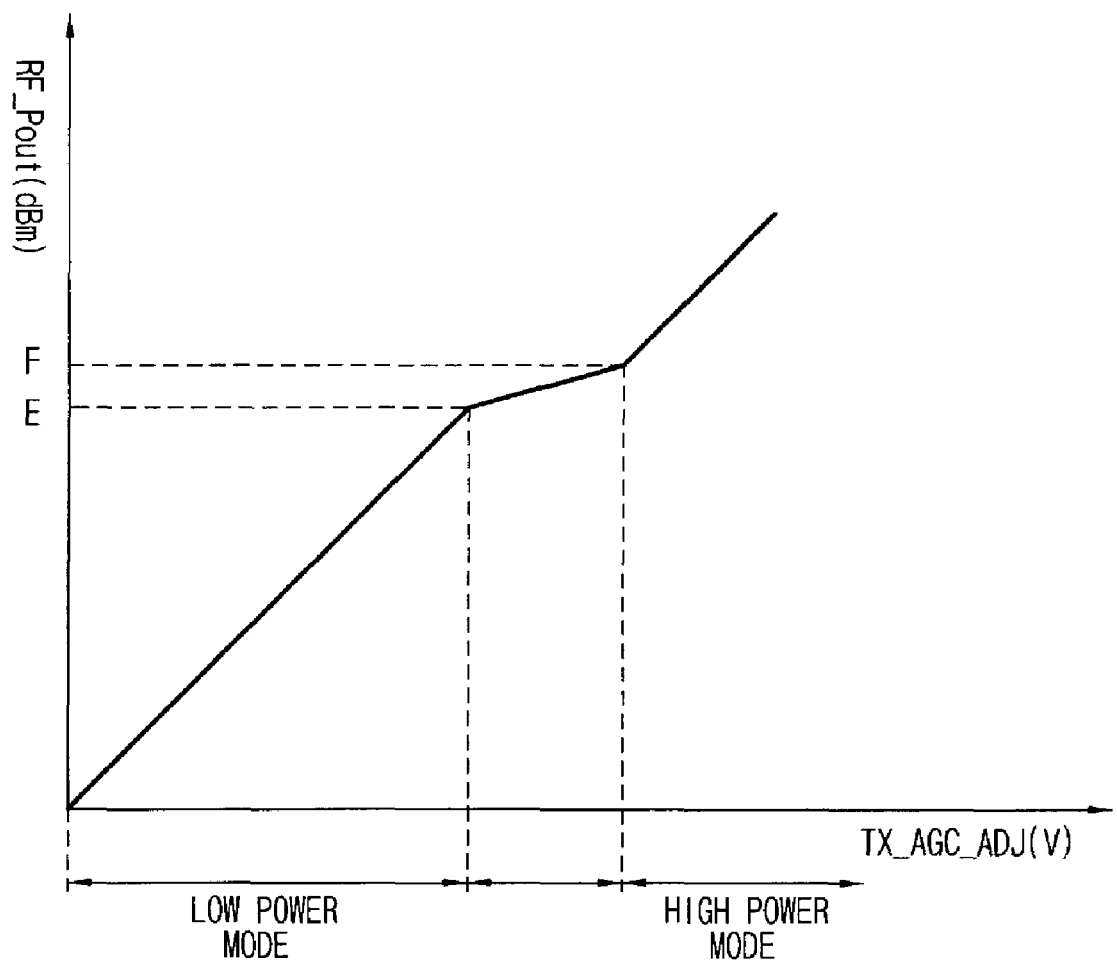
FIG. 5 is a graph illustrating a change of a transmission power of the control apparatus of FIG. 3 during a power mode conversion from a low power mode to a high power mode.

FIG. 5 shows a change of the transmission power during the power mode conversion from the lower power mode to the high power mode of the transmission power control apparatus of the present invention. As shown in FIG. 5, when the reference voltage tuner 10b is switched from a low power mode to a high power mode according to the increase in the transmission gain control signal (TX_AGC_ADJ), the output of the PAM 5 continuously increases with a transition stage without a jump up or burst.

Figure 6:
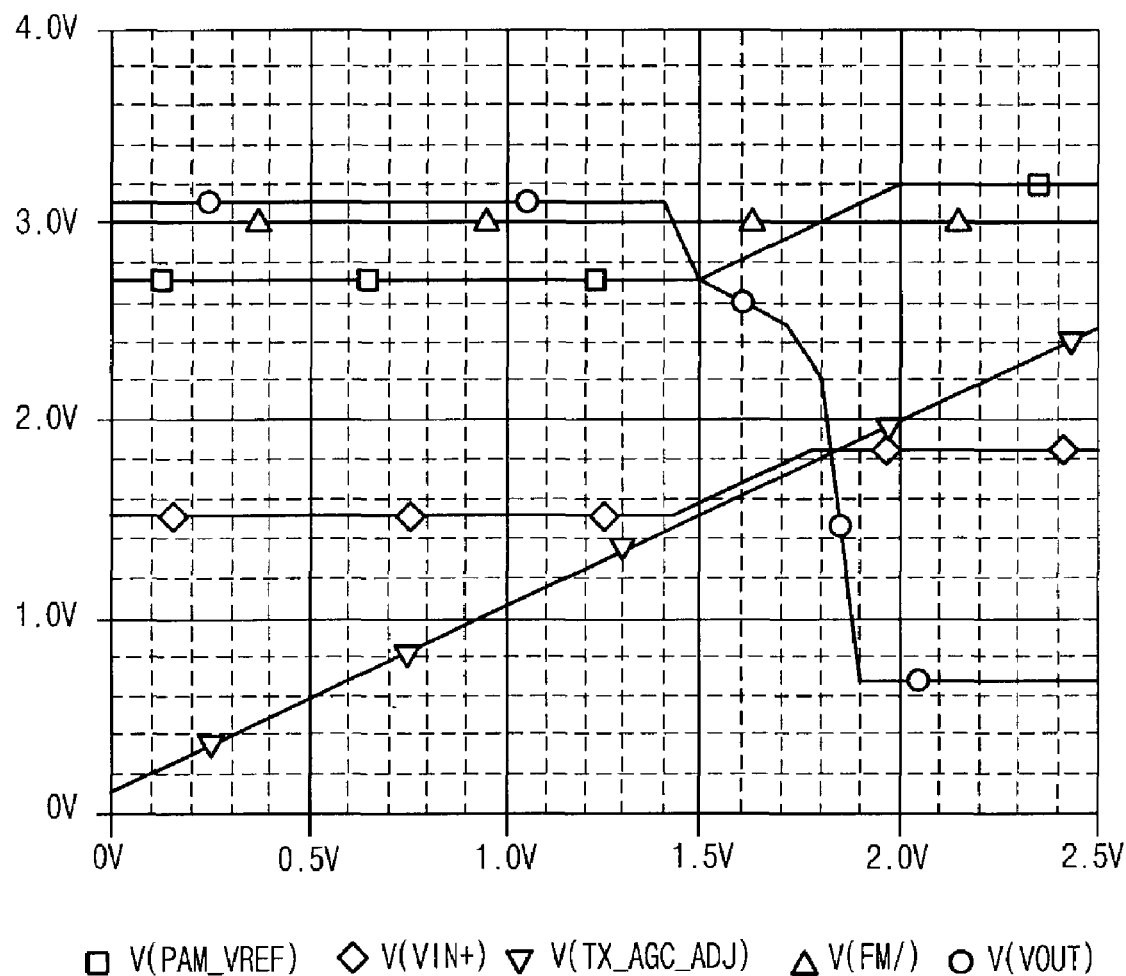
FIG. 6 is a graph showing a simulation result of the transmission power control apparatus of FIG. 3.

FIG. 6 is a graph showing a simulation result of a transmission and reception power control apparatus depicted in FIG. 3. As shown in FIG. 6, when a certain level ($\diamond$VIN+) is inputted to the non-inverting terminal (+) of the actuator 10a, the level voltage (VTX_AGC_ADJ) of the transmission gain control signal (TX_AGC_ADJ) gradually increases to exceed a critical value (about 1.5V). In contrast, the output level voltage ($\bigcirc$:VOUT) of the actuator 10a gradually decreases, and to the contrary, the reference voltage ($\square$:PAM_VREF) gradually increases.

Based on the description set forth above, the transmission power control apparatus of a mobile terminal of the present invention has many advantages. For example, since the change of the reference voltage (Vref) is always under control in the power mode conversion, the burst noise occurrence in the transmission power (RF_Pout) due to the sudden reference voltage change can be restrained. Increased battery time can be achieved by applying a low reference voltage in the low power mode. In addition, even though the close loop power control is performed in the CDMA mode, the reference voltage (Vref) is fixed in a high power mode in the AMPS mode so that a stable transmission power can be maintained.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A transmission power control apparatus for a mobile terminal comprising:
    a mobile station control unit for controlling a power control of the mobile terminal;
    an intermediate frequency (IF) gain controller for adjusting IF gain of a transmission IF signal generated from a IF processor based on an IF gain control signal from the mobile station control unit;
    a power amplifier module (PAM) for amplifying the adjusted transmission IF signal; and
    a reference voltage control unit for adjusting reference voltage based on a transmission gain control signal from the mobile station control unit,
    wherein the reference voltage control unit comprises:
    a reference voltage tuner for tuning a voltage from a transmission power source and providing a reference voltage to the PAM; and
    an actuator for actuating the reference voltage tuner based on the reference voltage tuner output and the transmission gain control signal from the mobile station control unit, and
    wherein the reference voltage tuner further comprises:
    a transistor of which a base terminal is connected to an output terminal of the actuator; and
    a first resistor traversing emitter and collector terminals of the transistor.

2. The apparatus of claim 1, wherein the collector terminal of the transistor is connected to a non-inverting terminal (+) of the actuator.

3. The apparatus of claim 2, wherein the transmission gain control signal is inputted to an inverting terminal (−) of the actuator.

4. The apparatus of claim 3, wherein a power mode of the reference voltage tuner is determined by a voltage inputted to the non-inverting terminal (+).

5. The apparatus of claim 4, wherein if the voltage inputted to the non-inverting terminal (+) is a low power mode voltage, a high voltage is applied to the base terminal of the transistor, if the voltage inputted to the non-inverting terminal (+) is equal to or greater than the low power mode voltage, a low voltage is applied to the base terminal of the transistor.

6. The apparatus of claim 5, wherein when the voltage of the transmission gain control signal inputted to the inverting terminal (−) is increased to exceed the low power mode voltage, the voltage to the non-inverting terminal (+) gradually increases up to the high power mode voltage.

7. The apparatus of claim 6, wherein the low power mode voltage is 1.5V.

8. The apparatus of claim 7, wherein while the low power mode voltage is applied to the non-inverting terminal (+), a serial resistance connected to the transmission power source is determined by an internal resistance of the transistor and a resistance of the first resistor.

9. The apparatus of claim 8, wherein if the voltage inputted to the non-inverting terminal (+) is equal to or greater than the low power mode voltage, the serial resistance to the transmission power source becomes '0'.

10. The apparatus of claim 1, further comprising a system mode select switch for selectively supplying an output of the power amplifier to the actuator.

11. The apparatus of claim 10, wherein if a system mode select signal from the mobile station control unit is low, the system mode select switch is turned off if the system mode select signal from the mobile station control unit is high, the system mode select switch is turned on.

12. The apparatus of claim 11, wherein if the system mode select switch is OFF, the mobile terminal enters an advanced mobile phone system (AMPS) mode and the reference voltage tuner constantly operates in a high power mode.

13. The apparatus of claim 12, wherein when the system mode select switch is ON, the mobile terminal enters a code division multiple access (CDMA) mode and the power mode of the reference voltage tuner is set according to the transmission gain control signal.

14. The apparatus of claim 13, wherein if the mobile terminal enters the CDMA mode, the collector terminal of the transistor is connected to the non-inverting terminal (+) of the actuator.

15. The apparatus of claim 14, wherein the transmission gain control signal is inputted to the inverting terminal (−) of the actuator.

16. The apparatus of claim 15, wherein the power mode of the reference voltage tuner is determined by a voltage inputted to the non-inverting terminal (+).

17. The apparatus of claim 16, wherein if the voltage inputted to the non-inverting terminal (+) is a low power mode voltage, a high voltage is applied to the base terminal of the transistor, if the voltage inputted to the non-inverting terminal (+) is equal to or greater than the low power mode voltage, a low voltage is applied to the base terminal of the transistor.

18. The apparatus of claim 17, wherein if the voltage of the transmission gain control signal inputted to the inverting terminal (−) increases to reach the low power mode voltage, the voltage inputted to the non-inverting terminal (+) gradually increases up to the high power mode voltage.

19. The apparatus of claim 18, wherein the low power mode voltage is 1.5V.

20. The apparatus of claim 19, wherein while the low power mode voltage is being applied to the non-inverting terminal (+), a serial resistance connected to the transmission power source is determined by the internal resistance of the transistor and a resistance of the first resistor.

21. The apparatus of claim 20, wherein if the voltage inputted to the non-inverting terminal (+) is equal to or greater than the low power mode voltage, the serial resistance to the transmission power source becomes '0'.

22. The apparatus of claim 21, wherein the transmission gain control signal is TX_AGC_ADJ.

23. The apparatus of claim 22, wherein the transmission power source is VCC_TX.

24. A method of controlling transmission power for a mobile terminal comprising:
controlling a power control of the mobile terminal by a mobile station module (MSM);
adjusting an intermediate frequency (IF) gain of a transmission IF signal generated from an IF processor based on an IF gain control signal from the mobile station control unit;
amplifying the adjusted transmission IF signal by a power amplifier module (PAM); and
determining a reference voltage based on a transmission gain control signal from the MSM, wherein the reference voltage determining further comprises:
tuning a reference voltage from a transmission power source and providing a reference voltage to the PAM by a reference voltage tuner; and
actuating the reference voltage tuner based on the reference voltage tuner output and the transmission gain control signal from the mobile station control unit by an actuator, and
wherein the reference voltage tuning comprises:
connecting a transistor base terminal to an output terminal of the actuator; and
traversing emitter and collector terminals of the transistor by a first resistor.

25. The method as claimed in claim 24, wherein the reference voltage tuning further comprises:
connecting the collector terminal of the transistor to a non-inverting terminal (+) of the actuator; and
inputting the transmission gain control signal to an inverting terminal (−) of the actuator.

26. The method as claimed in 25, further comprising determining a power mode of the reference voltage tuner by a voltage inputted to the non-inverting terminal (+).

27. The method as claimed in claim 24, further comprising selecting on a system mode select switch for supplying an output of the power amplifier to the actuator.

28. The method as claimed in claim 27, the system mode selecting further comprising:
switching the system mode select swith to ON, the mobile terminal enters a code division multiple access (CDMA) mode and the power mode of the reference voltage tuner is set according to the transmission gain control signal; and
switching the system mode select switch to OFF, the mobile terminal enters an advanced mobile phone system (AMPS) mode and the reference voltage tuner constantly operates in high power mode.

29. A transmission power control apparatus for a mobile terminal, comprising:
an error amplifier which generates a control voltage based on a comparison between a transmission gain control signal and a power mode signal; and
a non-linear circuit which generates a reference signal for a power amplifier module of the terminal based on the control voltage, said reference signal controlling an amplification degree of the power amplifier module,
wherein the non-linear circuit includes:
a bipolar transistor having a first terminal coupled to receive the control voltage from the error amplifier and a second terminal coupled to a supply voltage; and
a first resistive circuit connected to the transistor in parallel, wherein a node coupling the first resistive circuit to a third terminal of the transistor outputs a signal proportional to the reference signal for the power amplifier module.

30. The apparatus of claim 29, wherein the non-linear circuit suppresses a discontinuity in a transmission power curve when the terminal passes from a first power mode to a second power mode.

31. The apparatus of claim 30, wherein the first power mode is a low power mode and the second power mode is a high power mode, and wherein the power mode signal corresponds to a threshold indicative of the low power mode.

32. The apparatus of claim 29, wherein the first terminal is a base terminal and the second and third terminals are selected from the group consisting of an emitter terminal and a collector terminal.

33. The apparatus of claim 29, wherein the reference signal increases in value as the control voltage decreases in value.

34. The apparatus of claim 33, wherein the reference signal transitions from a low power mode amplification signal to a high power mode amplification signal when the control voltage reaches a predetermined value.

35. The apparatus of claim 34, wherein the predetermined value is substantially zero.

36. The apparatus of claim 29, further comprising:
  a mode switch which couples the third terminal of the transistor to a first terminal of the error amplifier which receives the power mode signal; and
  a second resistive network coupled between the first terminal of the error amplifier and the third terminal of the transistor.

37. The apparatus of claim 36, wherein the terminal operates in an AMPS mode when the switch is opened and operates in a CDMA mode when the switch is closed.

38. A method for controlling transmission power in a mobile terminal, comprising:
  comparing a transmission gain control signal to a power mode signal;
  generating a control voltage based on a difference between the transmission gain control voltage and the power mode signal;
  applying the control voltage to a non-linear circuit, which generates a reference signal for a power amplifier module; and
  controlling an amplification degree of the power amplifier module based on the reference signal,
  wherein the non-linear circuit includes:
  a bipolar transistor having a first terminal coupled to receive the control signal from the error amplifier and a second terminal coupled to a supply voltage; and
  a first resistive circuit connected to the transistor in parallel, wherein a node coupling the first resistive circuit to a third terminal of the transistor outputs a signal proportional to the reference signal for the power amplifier module.

39. The method of claim 38, wherein the non-linear circuit suppresses a discontinuity in a transmission power curve when the terminal passes from a first power mode to a second power mode.

40. The method of claim 39, wherein the first power mode is a low power mode and the second power mode is a high power mode, and wherein the power mode signal corresponds to a threshold indicative of the low power mode.

41. The method of claim 38, wherein the first terminal is a base terminal and the second and third terminals are selected from the group consisting of an emitter terminal and a collector terminal.

42. The method of claim 38, wherein the reference signal increases in value as the control signal decreases in value.

43. The method of claim 42, wherein the reference signal transitions from a low power mode amplification signal to a high power mode amplification signal when the control signal reaches a predetermined value.

44. The method of claim 43, wherein the predetermined value is substantially zero.

45. The method of claim 38, further comprising:
  a mode switch which couples the third terminal of the transistor to a first terminal of the error amplifier which receives the power mode signal; and
  a second resistive network coupled between the first terminal of the error amplifier and the third terminal of the transistor.

46. The method of claim 45, wherein the terminal operates in an AMPS mode when the switch is opened and operates in a CDMA mode when the switch is closed.

* * * * *